(12) United States Patent
Michiue et al.

(10) Patent No.: US 7,646,798 B2
(45) Date of Patent: Jan. 12, 2010

(54) NITRIDE SEMICONDUCTOR LASER ELEMENT

(75) Inventors: Atsuo Michiue, Komatsushima (JP); Tomonori Morizumi, Anan (JP); Hiroaki Takahashi, Anan (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 11/963,825

(22) Filed: Dec. 22, 2007

(65) Prior Publication Data

US 2008/0181274 A1 Jul. 31, 2008

(30) Foreign Application Priority Data

Dec. 28, 2006 (JP) ............................. 2006-356288
Dec. 14, 2007 (JP) ............................. 2007-323204

(51) Int. Cl.
*H01S 5/00* (2006.01)

(52) U.S. Cl. ..................................... 372/49; 372/44.011

(58) Field of Classification Search .............. 372/49.01, 372/44.011, 45.01, 43.01, 50.1, 628; 258/628
See application file for complete search history.

(56) References Cited

U.S. PATENT DOCUMENTS

| | | | | |
|---|---|---|---|---|
| 5,960,021 | A * | 9/1999 | De Vrieze et al. | 372/49.01 |
| 6,078,603 | A * | 6/2000 | Weegels et al. | 372/49.01 |
| 6,680,959 | B2 * | 1/2004 | Tanabe et al. | 372/45.01 |
| 7,057,211 | B2 | 6/2006 | Dwilinski et al. | |
| 2001/0022796 | A1 * | 9/2001 | Okada et al. | 372/49 |
| 2005/0170542 | A1 * | 8/2005 | Matsumura | 438/31 |
| 2005/0249255 | A1 * | 11/2005 | Dwilinski et al. | 372/49.01 |
| 2006/0193360 | A1 * | 8/2006 | Yamanaka | 372/49.01 |
| 2007/0025231 | A1 * | 2/2007 | Ochiai et al. | 369/122 |

FOREIGN PATENT DOCUMENTS

| | | |
|---|---|---|
| JP | H09-162496 A | 6/1997 |
| JP | H09-162497 A | 6/1997 |
| JP | H10-070338 A | 3/1998 |
| JP | 2002-100830 A | 4/2002 |
| JP | 2002-329926 A | 11/2002 |
| JP | 2002-335053 A | 11/2002 |
| JP | 2004-327637 A | 11/2004 |
| JP | 2005-079406 A | 3/2005 |
| JP | 2005-101457 A | 4/2005 |
| JP | 2006-024703 A | 1/2006 |
| JP | 2006-228892 A | 8/2006 |
| WO | WO-03/036771 | 5/2003 |

* cited by examiner

*Primary Examiner*—Minsun Harvey
*Assistant Examiner*—Tuan N. Nguyen
(74) *Attorney, Agent, or Firm*—Global IP Counselors, LLP

(57) ABSTRACT

A nitride semiconductor laser element comprises; a nitride semiconductor layer that includes a first nitride semiconductor layer, an active layer, and a second nitride semiconductor layer, and that has a cavity with end faces, and a protective film formed on at least one end face of the cavity, wherein the protective film is formed of a first film with a crystal structure that has the same axial orientation as that of the nitride semiconductor layer constituting the end face of the cavity, and a second film with a crystal structure that has a different axial orientation from that of the first film, in this order from the side of the end face.

11 Claims, 5 Drawing Sheets

C Aixs Orientation

M Aixs Orientation & C Aixs Orientation

M Aixs Orientation

NITRIDE SEMICONDUCTOR LASER ELEMENT

BACKGROUND OF THE INVENTION

1. Field of the Invention

The present invention relates to a nitride semiconductor laser element, and more particularly relates to a nitride semiconductor laser element having a protective film with a particular structure on at least one end face of the cavity.

2. Background Information

With a nitride semiconductor laser element, end faces of the cavity formed by RIE (reactive ion etching) or cleavage has a narrow bandgap energy, so absorption of the exiting light occurs at the end face, this absorption generates heat at the end face, and problems such as a short service life are encountered in trying to obtain a high-output laser. Consequently, there has been proposed, for example, a method for manufacturing a high-output semiconductor laser in which a silicon oxide or nitride film is formed as a protective film on the cavity end face (see, for example, Japanese Laid-Open Patent Application H10-70338). This protective film functions as a window layer, and suppresses optical absorption at the cavity end face.

However, even if a material of the protective film that can suppress optical absorption at the end face of the cavity is used in a nitride semiconductor laser element, differences in the lattice constant of the nitride semiconductor can produce cracks in the nitride semiconductor layer and the protective film, or separation of the protective film can occur, both of which are problems that preclude the desired function from being realized.

SUMMARY OF THE INVENTION

It is an object of the present invention to provide a nitride semiconductor laser element with which cracking of the nitride semiconductor and the protective film is suppressed, there is no separation of the protective film at the end face, and the characteristics are good.

The present invention provides a nitride semiconductor laser element comprising;

a nitride semiconductor layer that includes a first nitride semiconductor layer, an active layer, and a second nitride semiconductor layer, and that has a cavity with end faces, and a protective film formed on at least one end face of the cavity, wherein the protective film is formed of a first film with a crystal structure that has the same axial orientation as that of the nitride semiconductor layer constituting the end face of the cavity, and a second film with a crystal structure that has a different axial orientation from that of the first film, in this order from the side of the end face.

Further, the present invention provides a nitride semiconductor laser element having a laminated structure that includes a first nitride semiconductor layer, an active layer, and a second nitride semiconductor layer, and that has a cavity with end faces being substantially perpendicular with respect to the surface of the laminated structure, wherein a protective film is formed on at least one end face of the cavity, and is composed of a first film that widens the bandgap energy at active region of the end face of the cavity, and a second film having a crystal structure with different axial orientation from that of the first film.

With the present invention, by forming a protective film which comprises a first film having a crystal structure with the same axial orientation as that of the nitride semiconductor layer constituting the end face of the cavity and a second film having a crystal structure with the different axial orientation as the first film in this order, it is widened the bandgap energy of the end face of the cavity, which improves COD level, and will relieve the stress at the interface between the first and second films, and therefore provides a high-output element with which cracking of the nitride semiconductor and the protective film is suppressed and separation of the protective film is prevented.

DETAILED DESCRIPTION OF THE PREFERRED EMBODIMENTS

Figure 1:
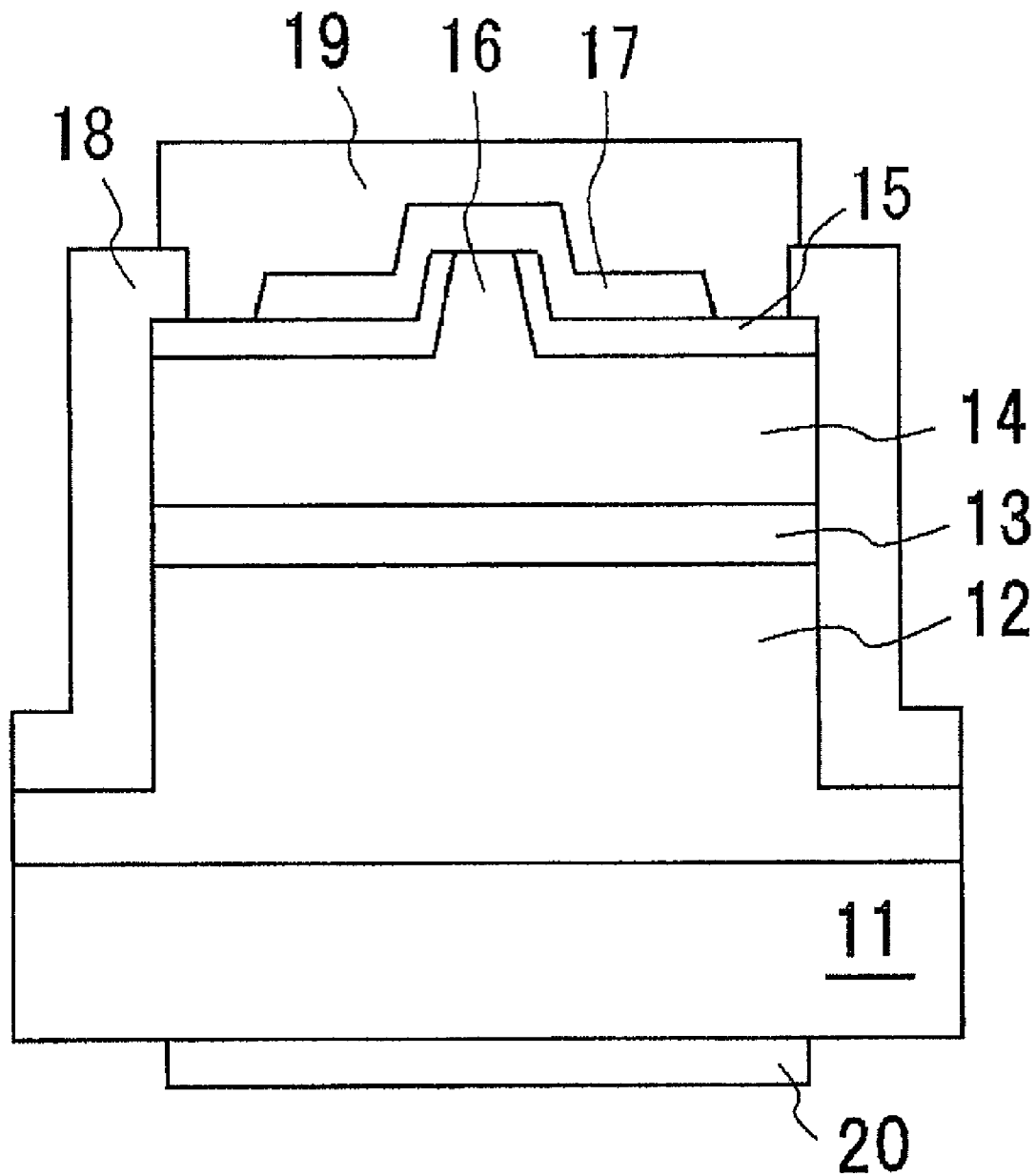
FIG. 1 is simplified cross section illustrating the structure of the laser elements of the present invention.

As typically shown in FIG. 1, for example, the nitride semiconductor laser element of the present invention mainly includes a first nitride semiconductor layer 12, an active layer 13, and a second nitride semiconductor layer 14, and a cavity is formed. This nitride semiconductor laser element is usually formed on a substrate 11, a ridge 16 is formed on the surface of the second nitride semiconductor layer 14, and a protective film is formed on at least one end face of the cavity (see, 21a and 21b as shown in FIG. 2A, and 21a, 21b, 22 or 23 as shown in FIG. 2B) as well as an embedded film 15, a p-electrode 17, an n-electrode 20, a second protective film 18, and so forth are formed.

Figure 2A:
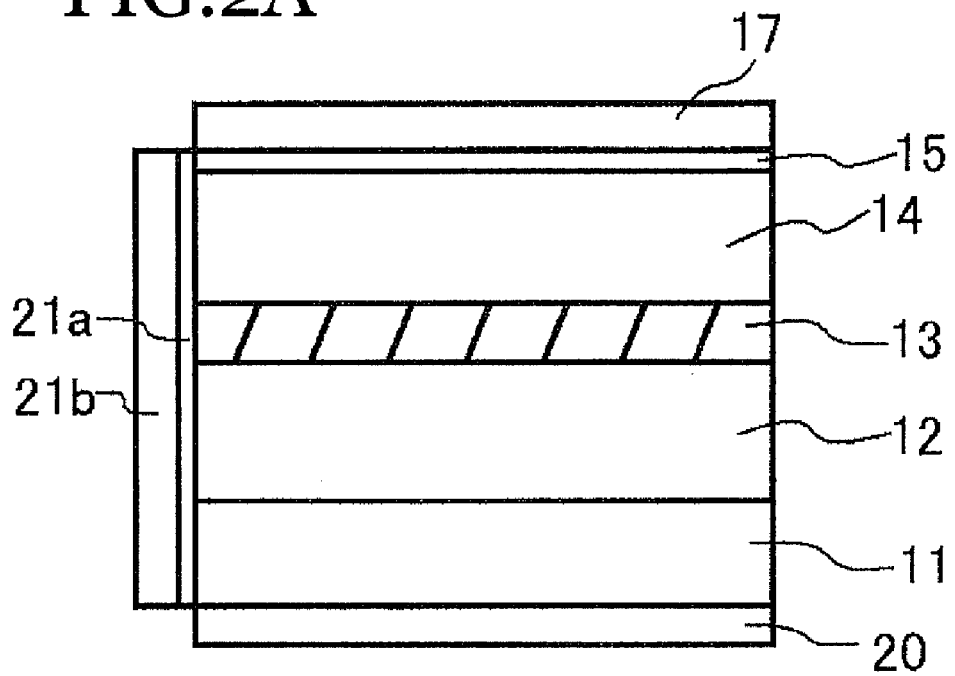
FIGS. 2A and 2B are simplified cross sections illustrating the structure of the protective film of the present invention.
Figure 2B:
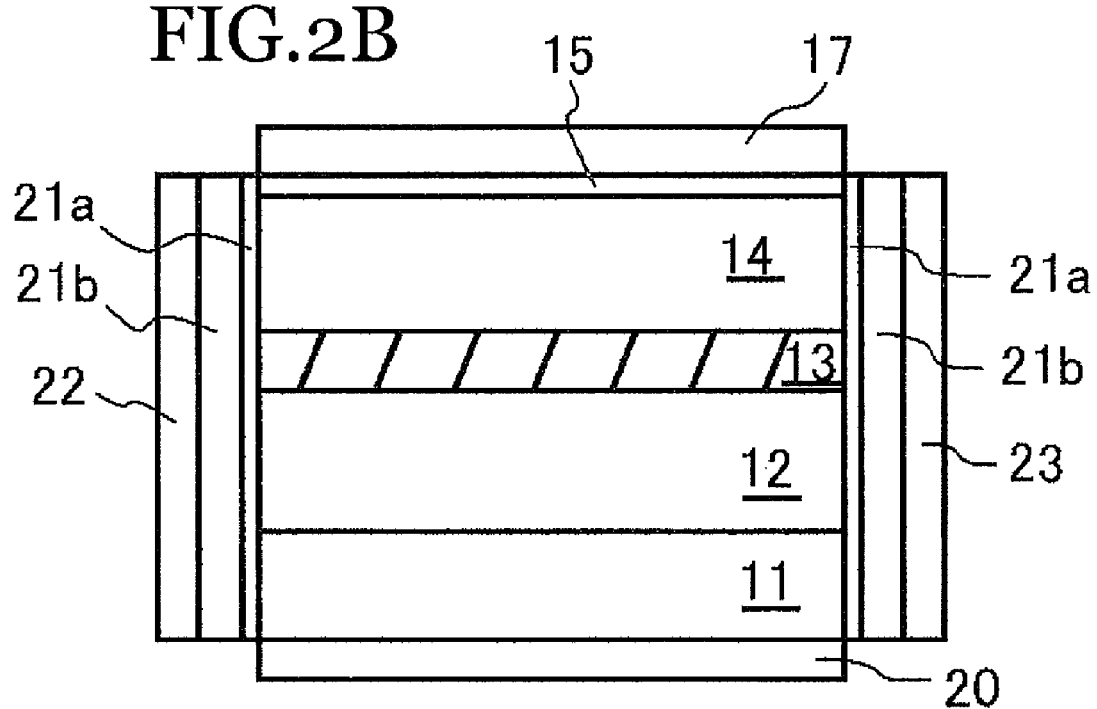

As shown in FIGS. 2A and 2B, the protective film is formed on at least one end face of the cavity, and comprises a first film 21a oriented along the same axis as that of the nitride semiconductor layer constituting the end face of the cavity, and a second film 21b having a different axial orientation from that of the first film 21a. Examples of the material of the protective film include oxides (such as, oxides of Si, Mg, Al, Hf, Nb, Zr, Sc, Ta, Ga, Zn, Y, B, Ti and the like), nitrides (such as, AlN, AlGaN, BN and the like), and fluorides. In particular, the first and second films may be preferably films having a hexagonal crystal structure. The first and second films may be formed from the different material to each other, but preferably formed from the same material. If the first and second films are both formed from the same material, this will prevent deterioration of the yield and of the element characteristics that would otherwise be caused by admixture of impurities and so forth during the manufacturing process.

Also, with the present invention, even if the protective films are formed from the same material, the first and second films with crystal structures of different axial orientation will have differences in their lattice constants and/or differences in their coefficients of thermal expansion. This make it possible to prevent the separation of the protective film, and to improve COD level. The reason for this is that forming a first film having a crystal structure with the same axial orientation as the end face on the exit side of the cavity widens the bandgap energy of the end face on the light exit side and forms a window structure, which prevents deterioration of the end face on the light exit side. If a second film having a crystal structure with a different axial orientation from that of the first film, but made of the same material, is formed over the first film, this will relieve the stress between the nitride semiconductor layer and the first film formed on its end face, and will prevent separation of the protective film.

More specifically, an example of this material is an AlN film. The total thickness of the protective film is preferably about 50 Å to 2 μm, for example. The protective film of the present invention may be formed on either the light reflecting side or the light exit side of the end face of the cavity, or may be formed on both end faces of the cavity.

With the present invention, the end face of the cavity preferably has orientation other than C axis orientation, and more preferably has M axis, A axis and R axis orientation, and preferably M axis orientation. Therefore, the first film is preferably orientated along the same axes as the end face of the cavity, that is, M axis, A axis, and R axis orientation, with respect to the end face having this orientation, and more preferably M axis orientation. The phrase "M axis orientation" here is not strictly limited to a state in which a single crystal is oriented along the M axis, and may encompass a state in which polycrystallines are also present, but site (also, portion(s) or part(s)) oriented along the M axis are included uniformly, or a state in which these are uniformly dispersed. When there is thus a polycrystalline state, there will not be a clear difference in the lattice constant from that of the end face of the cavity, and this difference can be lessened. The thickness of the first film is preferably from the level of a single atom to about 700 Å, and more preferably from 50 to 300 Å. Thus reducing the thickness of the first film prevents cracking in the nitride semiconductor and the protective film. Also, if the first film is oriented along the same axis as the end face of the cavity, it is possible to improve COD level, as described above.

When the first film has M axis, A axis or R axis orientation, and particularly M axis orientation, the second film is preferably a film that has a different axial orientation from that of the first film, for example a film with C axis orientation.

In this Specification, the phrase "a crystal structure that has a different axial orientation from that of the first film" means that when the orientation of a crystal structure is measured with an XRD (X-ray diffraction) apparatus, a part of or all of the film being measured (hereinafter referred to as the second film) will have a crystal structure having a different axial orientation peak from that of the first film, and that the film being measured does not have the same crystal structure as that of the first film, as a whole. It also means that even if the second film has the axial orientation peak of the first film, a peak of different axial orientation is stronger than the peak of axial orientation of the first film.

Figure 3A:
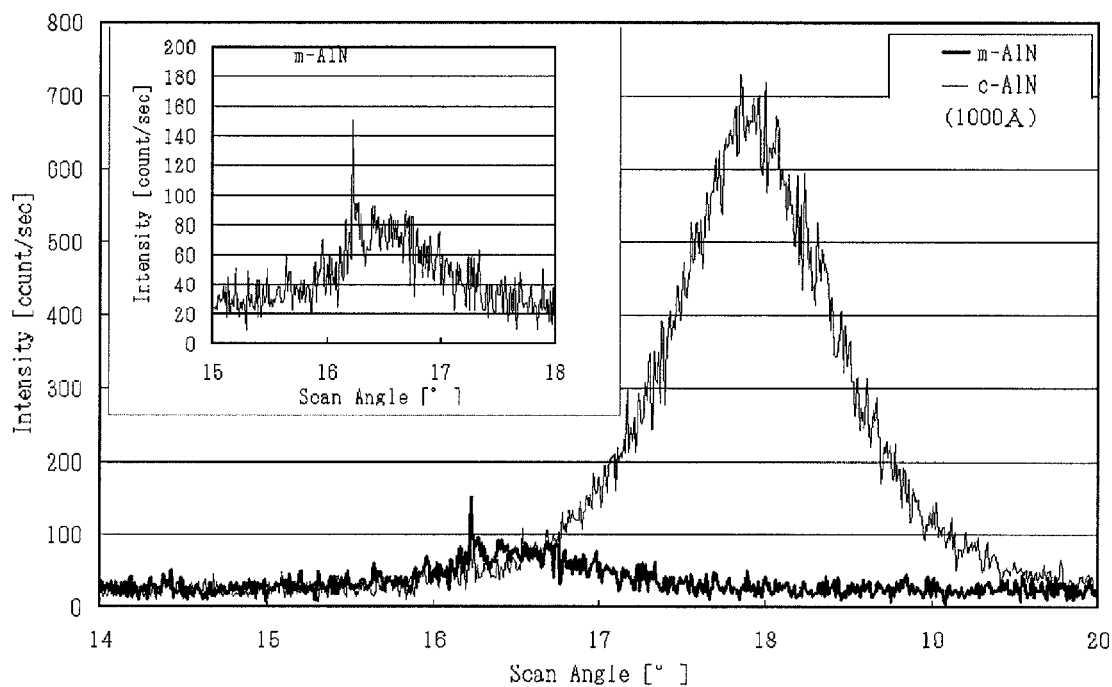
FIG. 3A is a graph showing diffracted intensity of the X-ray of the protective film (total thickness: 1000 Å) for confirming the orientation.
Figure 3B:
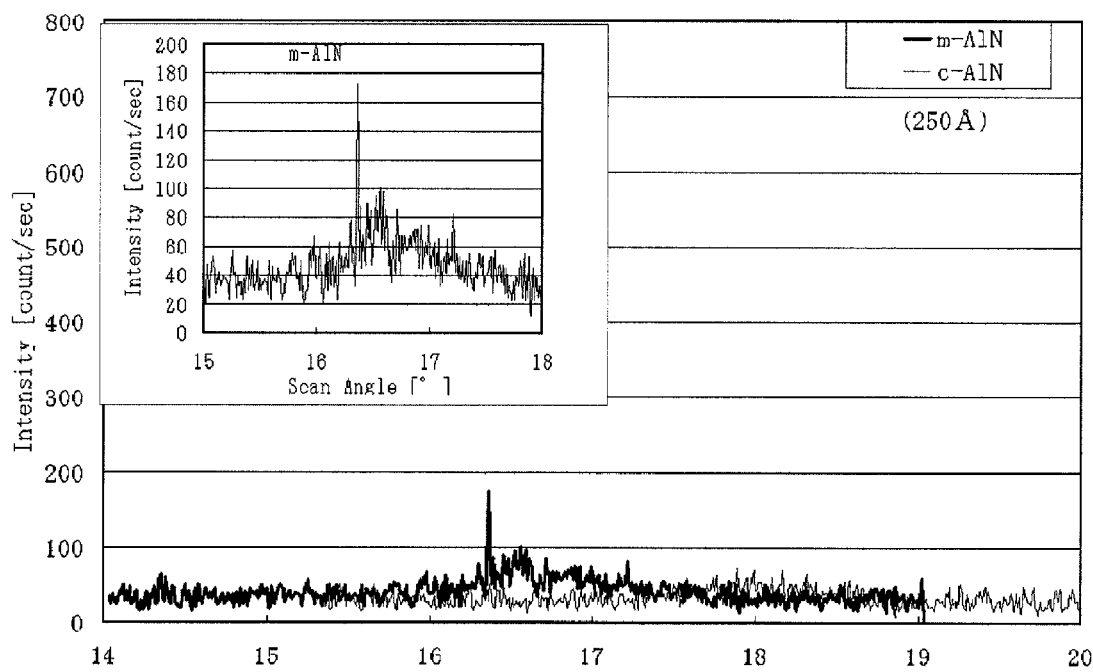
FIG. 3B is a graph showing orientation strength diffracted intensity of the X-ray of the protective film (total thickness: 250 Å) for confirming the orientation.

FIG. 3A is a graph showing peak strength of orientation of the second film with C axis orientation (thickness: 750 Å) formed on the first film with M axis orientation (thickness: 250 Å), which has total thickness of 1000 Å. FIG. 3B is a graph showing peak strength of orientation of the first film with M axis orientation (thickness: 250 Å). In FIG. 3A, the peak of C axis orientation is greater than the peak of M axis orientation. This is just an example, but in this case the second film can be said to have a crystal structure with a different axial orientation from that of the first film.

The state of a protective film is generally classified as monocrystalline, polycrystalline, or amorphous, depending on the degree of crystallization of the material that makes up the protective film. Monocrystallines have almost no variation in lattice constant among materials, and there is almost no lattice plane inclination. To put this another way, the atoms in the material are arranged in a regular pattern, and order is maintained over an extended distance. Polycrystallines are made up of numerous microscopic monocrystallines, i.e., microcrystallines. An amorphous material is one that has no periodic structure such as that in a crystal, that is, it means that the atomic arrangement is irregular and there is no order over an extended distance.

The state of the film (crystalline or a crystal state in the case of a crystal substance) can be easily evaluated from a diffraction image produced by electron beam. That is, an electron beam is directed at the film, and an electron beam diffraction image appears corresponding to the planar direction and the size of the lattice constant. For instance, in the case of a monocrystalline, since the crystal planes are almost aligned, the diffraction points are observed to aligned with good regularity. In the case of a polycrystalline, since it is made up of microcrystals, the lattice planes are not all facing the same way, and the diffraction points may come together in a complex fashion, or Debye rings may be seen. In the case of an amorphous material, meanwhile, since the atomic arrangement does not have a periodic structure over an extended distance, no electron beam diffraction occurs. Therefore, this is observed as a state in which the diffraction image has no diffraction points.

How the elements that make up a crystal are arranged can be grasped visually by electron beam diffraction.

That crystallinity is different (that is, that the axial orientation of crystals is different) can be confirmed not only by TEM, STEM (Scanning Transmission Electron Microscope), SEM (Scanning Electron Microscope), and other kinds of cross section observation (bright field, limited field, high resolution, etc.), but also by electron beam diffraction or the product of subjecting these patterns to FFT (Fast Fourrier Transform), or from the difference in the etching rate.

In other words, in observing a protective film under a microscope, a difference can be visually ascertained, which is due to a difference in crystallinity.

In particular, in observation by STEM, TEM or the like, a contrast is observed due to the different states of the film (crystalline or a crystal state in the case of a crystal substance).

Also, even when the same film is observed, contrast will sometimes be observed to be inverted when the observation conditions (STEM or TEM image display settings) are changed.

An electron beam diffraction image can be observed by cutting the protective film so that a cross section is exposed with respect to the end face where the protective film is formed, and directing an electron beam at this cross section. The electron beam diffraction image observation can be carried out, for example, using a JEM-2010F made by JEOL.

TEM observation can be carried out, for example, using a JEM-2010F made by JEOL. Observation is conducted by the following procedure. First, a specimen is cut out by microprobing using a focused ion beam (FIB) machining apparatus (for example, SMI3050MS2 made by Seiko Instruments Inc.), and a thin film (for example, at least about 100 nm) is obtained by subjecting the specimen to FIB machining. Further thin film (for example, at least about 50 nm) working is performed by ion milling. Then, a dark field image can be obtained by performing TEM observation at a prescribed acceleration voltage.

Furthermore, if the protective film thus obtained is immersed in a suitable etchant, such as an acid solution (for example, buffered hydrofluoric acid or the like) or alkali solution (for example, KOH or the like), a difference in crystallinity can be discerned from a difference in solubility (etching rate difference). In this etching, a material with poor crystallinity will be quickly dissolved or removed, while a material with good crystallinity will remain or be preserved.

These are not the only methods that can be used, and the crystallinity of a protective film can be evaluated using any known method.

Stress produced by a difference in the coefficients of thermal expansion or the lattice constants between the first film and the nitride semiconductor layer can be relieved by forming over the first film a second film that has a crystal structure with a different axial orientation from that of the first film.

The composition and/or orientation may change abruptly or gradually between the first film and second film. The second film should be different partly or wholly, and preferably wholly from the orientation of the first film (i.e., end face of the cavity side) at least at its outermost surface. When the orientation changes abruptly or gradually, crystals having the orientation of the first film will be mixed with crystals having the orientation of the second film in this region of change, and the orientation of the film is preferably varied by varying the proportions of these two kinds of crystal so that the orientation of the second film is more prevalent than the orientation of the first film.

When a protective film having a hexagonal crystal structure composed of a first film with the same axial orientation as that of the end face of the cavity and a second film with a different axial orientation from that of the first film is formed on the end face of the cavity, no stress is produced in the nitride semiconductor that makes up the end face of the cavity, so there is no cracking in the nitride semiconductor and the first film, it fits more snugly against the end face of the cavity, and separation is prevented, and this in turn improves COD level. The thickness of the second film is preferably enough to relieve stress between the nitride semiconductor layer and the first film. In terms of heat dissipation at the end face, a certain amount of thickness is preferable. There are no particular restrictions on the thickness, but the thickness is preferably 100 to 3000 Å.

It is also preferable for the second film of this protective film to be formed thicker than the first film.

Figure 4:
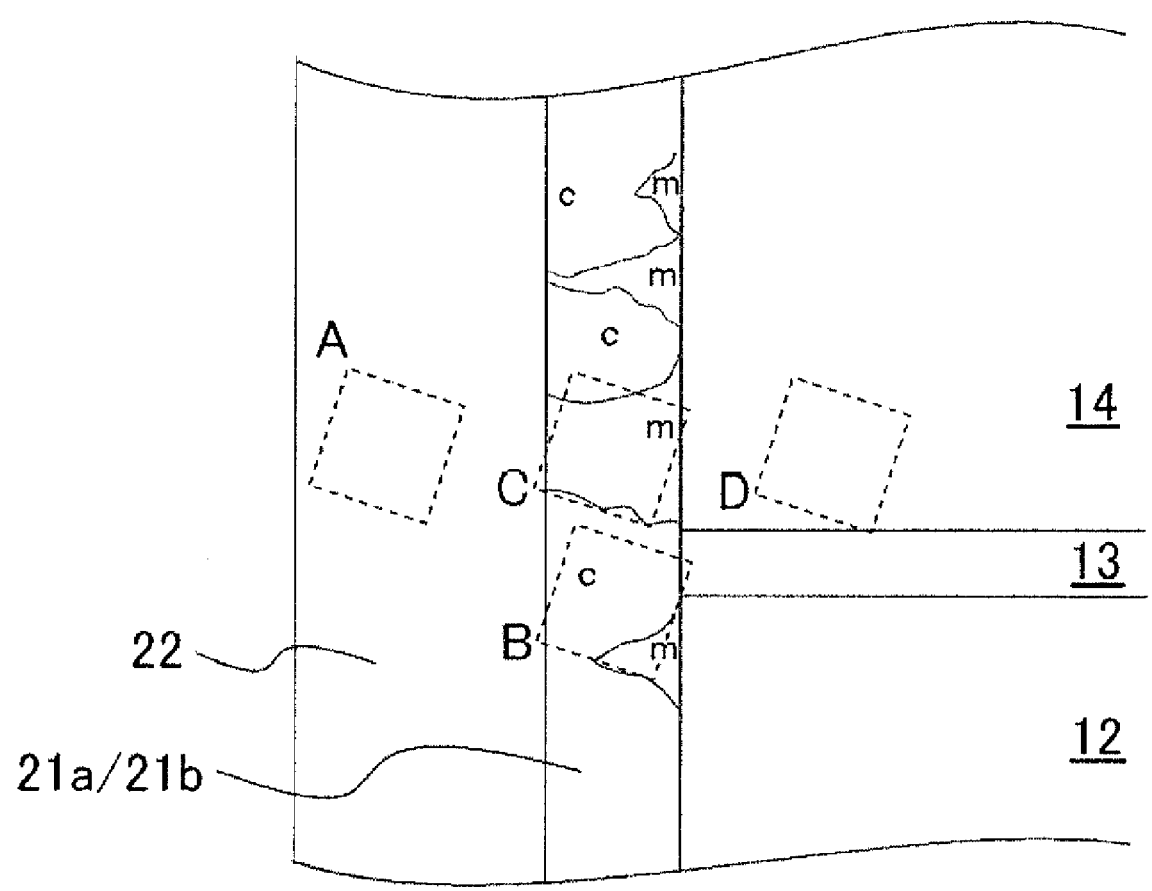
FIG. 4 is simplified cross section illustrating the structure of the protective film of the present invention.

Furthermore, the protective film (that is, the first film and second film) does not need to have a uniform orientation throughout a plane, and polycrystallines may be admixed, but sites having a certain orientation may be uniformly included, or a certain orientation may be uniformly dispersed. Also, this plane may include a partial region of different axial orientation. For example, as shown in FIG. 4, the protective film may be formed as a end face protective film in which a first film 21a having crystal structure with the same axial orientation as that of the nitride semiconductor layer constituting the end face of the cavity and a second film 21b having a crystal structure with the different axial orientation from that of the first film are formed in this order in parts of the protective film.

The first and second films can be formed, for example, by a method that is known in this field. For instance, this can be vapor deposition, sputtering, reactive sputtering, ECR (electron cyclotron resonance) plasma sputtering, magnetron sputtering, ion beam assist deposition, ion plating, laser ablation, CVD (Chemical Vapor Deposition), spraying, spin coating, dipping, a combination of these two or more methods, a combination of these methods and acid treatment (thermal treatment), or any of various other methods, and preferably ECR plasma sputtering.

In particular, to obtain a first film that has the same axial orientation as the end face of the cavity, although it will depend on the film formation method, it is preferable to control film formation by subjecting the end face of the cavity to a nitrogen plasma treatment prior to film formation, or to adjust the film formation rate to a relatively slow rate, or to control the atmosphere during film formation (to a nitrogen atmosphere, for example), or to adjust the film formation pressure to a relatively low level, etc. Two or more of these methods may also be combined. Also, to form a second film that has a different axial orientation from that of the first film, although it will be depend on the film formation method, it is preferable to control film formation by adjusting the film formation rate to a faster rate, or to control the atmosphere during film formation (such as by lowering the nitrogen partial pressure), or to adjust the film formation pressure to a higher level, etc. Two or more of these methods may also be combined.

Also, in forming the first and second films, the end face of the cavity may be pretreated with a nitrogen plasma, and different film formation methods may be employed for the first and second films, such as using ECR plasma sputtering for the first film and magnetron sputtering for the second film.

Also, the nitrogen partial pressure may be gradually or abruptly changed during the film formation in each method, or the film formation pressure may be gradually or abruptly changed.

In forming a film by sputtering, examples of methods include a method in which a first film material is used as a target and the film formation rate is gradually or abruptly increased, or the RF power is gradually or abruptly increased (with the range of increase being about 50 to 500 W), or the distance between the target and substrate is gradually or abruptly changed (with the range of change being about 0.2 to 3 times the original distance), and a method in which the pressure is gradually or abruptly lowered (with the range of reduction being about 0.1 to 2.0 Pa) in the formation of a film using a first film material as a target. More specifically, when the film formation rate is adjusted, the first film is preferably formed at a rate of 5 to 100 Å/min, and the second film at a rate that is at least as high. Also, when RF power is adjusted, the first film is preferably formed at a power of 100 to 600 W, and the second film at a power that is at least as high.

With another method, in forming a film by sputtering, the temperature of the substrate is gradually or abruptly raised or lowered (with the range of change being about 50 to 500° C.). A heat treatment may be performed after this as desired.

These methods may also be combined as desired.

With the nitride semiconductor laser element of the present invention, as shown in FIG. 2B, an amorphous third film 22 is preferably laminated as a protective film over the second film. Forming this film prevents changes in the composition of the first and second films, and allows the first and second films to adhere more securely to the end face of the cavity. Examples of the material of the third film include oxides (such as, oxides of Si, Mg, Al, Hf, Nb, Zr, Sc, Ta, Ga, Zn, Y, B, Ti and the like), and preferably $SiO_2$. The third film may has any of single layer or laminated structure.

It is preferable for the third film to be formed thicker than the combined thickness of the first film and the second film. Providing a second film having a different crystal structure from that of the first film over the first film having a crystal structure with the same axial orientation as the end face of the cavity relieves the stress produced between the end face of the cavity and the first film and the second film, and suppresses separation between the protective film and the nitride semiconductor layer. Forming an amorphous third film over this relieves even more of the above-mentioned stress and affords a snug fit of the protective film. This prevents the protective film as a whole from separating. More preferably, the thickness of the third film is at least 1.5 times the combined thickness of the first film and the second film, and the total thickness of the protective film is no more than 2 µm. This results in the above-mentioned effect being even more pronounced.

Also, as shown in FIG. 2B, third films 22 and 23 can be formed from different materials, in different thicknesses, etc., on the end face of the light exit side and the reflecting side. The third film on the end face of the exit side is preferably formed from a single layer of $SiO_2$. The third film on the reflecting side can have a laminated structure of oxides of silicon and zirconium, a laminated structure of oxides of aluminum and zirconium, or the like. The lamination period and so forth can be suitably adjusted as dictated by the desired reflectivity.

In a preferred mode of the third film, the third film on the end face of the exit side is formed from a single layer of $SiO_2$, and the third film on the reflecting side is formed by a laminated structure of $SiO_2$ and $ZrO_2$.

The amorphous third film can be formed by any of the known methods listed as examples for the above-mentioned first and second films, for example. In particular, to obtain the third film of amorphous, although it will depend on the film formation method, it is preferable to adjust the film formation rate to a relatively fast rate, or to control the atmosphere during film formation (to a oxygen atmosphere, for example), or to adjust the film formation pressure to a relatively high level, etc. Two or more of these methods may also be combined. When the oxygen atmosphere is controlled, oxygen is preferably introduced to the extent that there will be no absorption. As to the specific film formation conditions, it is preferable if a film is formed using a silicon target in a sputtering apparatus, the flow of oxygen is 3 to 20 sccm, and the RF power is about 300 to 800 W.

In the present invention, the substrate for forming the nitride semiconductor laser element may be an insulating substrate or a conductive substrate. The substrate is, for example, preferably a nitride semiconductor substrate having an off angle of no more than 10° and greater than 0° to the first main face and/or the second main face. The thickness of the substrate is at least 50 µm and no more than 10 mm, for example. A commercially available substrate, any of the various known substrates disclosed, for instance, in Japanese Laid-Open Patent Application 2006-24703, or the like may be used.

The nitride semiconductor substrate can be formed by a vapor phase growth method such as MOCVD (Metal Organic Chemical Vapor Deposition), HVPE (Hydride Vapor Phase Epitaxy), MBE (Molecular Beam Epitaxy), or the like, a hydrothermal synthesis method in which crystals are grown in a supercritical fluid, a high pressure method, a flux method, a melt method, or the like.

The nitride semiconductor layer may include a layer having a general formula of $In_xAl_yGa_{1-x-y}N$ ($0 \leq x \leq 1$, $0 \leq y \leq 1$, $0 \leq x+y \leq 1$). In addition to this, it may be used the semiconductor layer which is partly substituted with B as a group III element, or is substituted a part of N as a group V element with P or As. The n-side nitride semiconductor layer may doped with at least one n-type impurity of IV or VI group elements, such as Si, Ge, Sn, S, O, Ti, Zr, Cd etc. And the p-side nitride semiconductor layer may doped with at least one p-type impurity, such as Mg, Zn, Be, Mn, Ca, Sr etc. The doped concentration is, for example, about $5 \times 10^{16}/cm^3$ to about $1 \times 10^{21}/cm^3$. All of layers in the n-type or p-type nitride semiconductor layers may not necessarily contain n-type or p-type impurity.

The active layer may be a multiple quantum well or single quantum well structure.

The nitride semiconductor layer may has a structure which is a SCH (Separate Confinement Heterostructure) wherein an optical waveguide is constituted by providing n-side and p-side optical guide layers above and below the active layer. However, there is no particular restriction on these structures.

Also, the active layer preferably has a narrower bandgap energy than the first film. With the present invention, setting the bandgap energy of the first film wider than that of the active layer widens the bandgap energy of the end face, or to put it another way, widens the impurity level near the end face of the cavity, and forms a window structure, and this in turn improves COD level.

In the nitride semiconductor laser element of the present invention may emits laser light with a wavelength of about 370 to 500 nm, it is possible to prevent separation of the protective film and to improve COD level.

There is no particular restriction on a growth method of the nitride semiconductor layer, it can be formed by means of any known method which can grow these nitride semiconductor layers, such as MOVPE (Metal-Organic Vapor Phase Epitaxy), MOCVD, HVPE, MBE or the like. In particular, MOCVD is preferable because it allows the nitride semiconductor to be growth with good crystallinity.

A ridge is formed on the surface of the p-side nitride semiconductor layer. The ridge functions as an optical waveguide, the width of the ridge may be from 1.0 to 30.0 µm and preferably from 1.0 to 3.0 µm. The height of the ridge (the etching depth) may be, for example, may be from 0.1 to 2 µm. The extent of optical confinement can be suitably adjusted by adjusting the thickness, material, and so on of the layer that makes up the p-side semiconductor layer. The ridge is preferably set so as to be 200 to 5000 µm of cavity length. The ridge need not be all the same width in the extension direction of the cavity, and its side faces may be vertical or may be tapered with an angle of about 45 to 90°.

An embedded film is usually formed on the surface of the nitride semiconductor layer and to the side faces of the ridge. That is, the embedded film is above the nitride semiconductor layer, is in direct contact with the nitride semiconductor layer and an electrode (discussed below), and is formed in a region other than the region where an electrical connection is made. There are no particular restrictions on the position, size, shape, etc., of the region of connection between the nitride semiconductor layer and the electrode, but this region may, for example, be part of the surface of the nitride semiconductor layer, such as substantially the entire top face of the stripe-like ridge formed on the surface of the nitride semiconductor layer.

The embedded film is generally formed from an insulating material with a smaller refractive index than that of the nitride semiconductor layer. The refractive index can be measured using a polarizing ellipsometer (featuring ellipsometry), more specifically, it is, for example, HS-190 made by J. A. WOOLLAM and other ellipsometers. This embedded film is an insulator of a dielectric film of single layer or multilayer film composed of oxides, nitrides or oxide-nitrides of Zr, Si, V, Nb, Hf, Ta, Al Ce, In, Sb, Zn and the like. The embedded film may have monocrystalline, polycrystalline or amorphous structure. If a protective film is formed from the side faces of the ridge all the way to the surface of the nitride semiconductor on both sides of the ridge, it will ensure a refractive index difference versus the nitride semiconductor layer, and particularly the p-side semiconductor layer, which allows leakage of light from the active layer to be controlled, allows light to be confined efficiently within the ridge, and also better ensures insulation near the base of the ridge, so the generation of leak current can be avoided.

This embedded film can be formed by any method that is known in this field. For instance, a variety of methods can be used, such as vapor deposition, sputtering, reactive sputtering, ECR plasma sputtering, magnetron sputtering, ion beam assist deposition, ion plating, laser ablation, CVD, spraying, spin coating, dipping, a combination of these two or more methods, a combination of these methods and oxidation treatment (thermal treatment), or the like.

The electrode of the present invention refers to a pair of electrodes electrically connected with the p- and n-side nitride semiconductor layers. The p-side electrode is preferably formed over the nitride semiconductor layer and the embedded film. Separation of the embedded film can be prevented by forming the electrode continuously over the embedded film and the nitride semiconductor layer that is the outermost layer. In particular, separation of the embedded film formed on the ridge side faces can be effectively prevented by forming the electrode up to the ridge side faces.

The electrodes may preferably be formed with a single layer or laminated layer of a metal or metal alloy of palladium, platinum, nickel, gold, titanium, tungsten, cupper, silver, zinc, tin, indium, aluminum, iridium, rhodium, ITO (Indium Tin Oxide) or the like. The electrodes are suitable formed in a thickness of, for example, about 500 to about 5000 Å depend on the material used. The electrodes may be formed at least on the p-side semiconductor layer and the n-side semiconductor layer or the substrate, respectively, and further may be formed pad electrodes thereon with a conductive layer of a single layer or laminated layer. Also, the p-side and n-side electrodes may be formed on the same side with respect to the substrate.

A second protective film is preferably formed on the embedded film. This second protective film may be disposed over the embedded film on at least the surface of the nitride semiconductor layer, and preferably also covers the side faces of the nitride semiconductor layer and/or the side faces, surface, etc., of the substrate with or without the embedded film interposed therebetween. The second protective film can be formed from the same materials as those listed as examples for the embedded film. As a result, it is possible to ensure not only insulation reliably but also protection for the exposed side faces, surface, etc., of nitride semiconductor layer. The embedded film is preferably formed from the side faces of the nitride semiconductor layer up to the top face, a p-side pad electrode is preferably formed on the top faces of the p-side electrode and the second protective film.

Examples of the nitride semiconductor laser element of the present invention will now be described in detail through reference to the drawings, but the present invention is not limited to or by the following examples.

EXAMPLE 1

As shown in FIGS. 1 and 2B, the nitride semiconductor laser element of this Example comprises the first nitride semiconductor layer 12, the active layer 13, and the second nitride semiconductor layer 14 (on the surface of which is formed the ridge 16), laminated in that order on the substrate 11, and a cavity is formed. With this nitride semiconductor laser element, a protective film is formed on the end face of the cavity (see, 21a, 21b, 22 or 23 as shown in FIG. 2B), and also an embedded film 15, a p-side electrode 17, an n-side electrode 20, a second protective film 18, p-side pad electrode 19 and the like are formed.

The end face of the cavity is formed by a nitride semiconductor layer having M axis orientation, and as shown in FIG. 2, the protective film is composed of a first film 21a oriented along the same axis as the end face of the cavity, namely, the M axis, and a second film 21b oriented along the C axis, for at least one end face of the cavity. The first and second films are both composed of AlN, the combined thickness is about 1200 Å, for example, and the thickness of the first film is about 200 Å. The orientation state gradually changes from the first film to the second film.

This laser element can be manufactured by the following method.

First, a GaN substrate is provided. This substrate is conveyed into a reaction vessel, and a layer composed of $Al_{0.03}Ga_{0.97}N$ doped with Si at $4 \times 10^{18}/cm^3$ (2 μm thick) is grown at a growth temperature of 1160° C. using trimethylaluminum (TMA), trimethyl gallium (TMG) and ammonia ($NH_3$) as the raw material gas with a silane gas for an impurity gas. This n-side clad layer may be composed of a multilayer film (superlattice structure).

Next, the silane gas is stopped, and n-side wave guide layer composed of undoped GaN (0.175 μm thick) is grown at a growth temperature of 1000° C. This wave guide layer may be doped with n-type impurities.

The temperature is set to 900° C., a barrier layer composed of $In_{0.02}Ga_{0.98}N$ doped with Si (140 Å thick) and at same temperature, a well layer composed of undoped $In_{0.07}Ga_{0.93}N$ (70 Å thick) are laminated on the barrier layer. This process is repeated 2 times, finally the barrier layer is formed on the layers to grow an active layer composed of a multi quantum well structure (MQW)) with a total thickness of 560 Å.

A p-side cap layer composed of p-$Al_{0.25}Ga_{0.75}N$ doped with Mg at $1 \times 10^{20}/cm^3$ (100 Å thick) is grown on the active layer using TMG, TMA, $NH_3$, and $Cp_2Mg$ (bis-cyclopentadienyl magnesium) at a growth temperature of 1000° C., which has a bandgap energy wider than the p-side wave guide layer as described below. This p-side wave guide layer can be omitted.

Next, $Cp_2Mg$ gas and TMA are stopped, and p-side wave guide layer composed of undoped GaN (0.145 μm thick) is grown at a growth temperature of 1000° C., which has a bandgap energy narrower than the p-side cap layer.

The temperature is set to 1000° C., and an A layer composed of undoped $Al_{0.10}Ga_{0.90}N$ (25 Å thick) is grown, then $Cp_2Mg$ gas and TMA are stopped, and a B layer composed of undoped GaN (25 Å thick) is laminated. The A layer and the B layer are alternately laminated, and this process is repeated to grow an p-side clad layer composed of a superlattice structure with a total thickness of 0.4 μm.

Finally, a p-side contact layer composed of GaN doped with Mg at $1 \times 10^{20}/cm^3$ (150 Å thick) is grown on the p-side clad layer at a growth temperature of 1000° C.

The resulting wafer on which the nitride semiconductor has been grown is taken out of the reaction vessel, and a protective film composed of $SiO_2$ is formed as a stripe with a width (a length in a direction perpendicular to the end face of the cavity) of 800 μm on the surface of the p-side contact layer (the outermost layer). This portion will be main body of the cavity in the laser element. The cavity length may be preferably set to the range from 200 to 5000 μm.

Next, a SiO$_2$ protective film is formed as a stripe-shaped mask on the surface of the p-side contact layer, and RIE etching is performed using SiCl$_4$ gas. By these means, a stripe ridge waveguide region is formed.

Then, the sides of the ridge are protected by an insulating layer (i.e., an embedded film) composed of ZrO$_2$.

Next, a p-electrode composed of Ni (100 Å)/Au (1000 Å)/Pt (1000 Å) is formed on the surface overlying the p-side contact layer and the insulating layer. Subsequently, a protective film composed of silicon oxide (SiO$_2$: 0.5 μm thick) is formed by sputtering on the p-electrode and the embedded film, and on the sides of the semiconductor layer.

After that, ohmic annealing is performed at 600° C.

Next, Ni (80 Å)/Ti (2000 Å)/Au (8000 Å) are formed continuously in this order on the exposed p-electrode that is not covered by the protective film, to produce a p-side pad electrode.

And then, the surface of the substrate which is opposite to the side growing the nitride semiconductor layers is polished so as to have a thickness of 80 μm.

An n-electrode composed of Ti (150 Å)/Pt (2000 Å)/Au (3000 Å) is formed on the polished surface of the substrate.

Next, recessed grooves are formed on the side of the first principal face of the substrate in a wafer state having the n-electrode, the p-electrode and the p-side pad electrode. These grooves is set to depth of 10 μm, the length of 50 μm in the direction parallel to the end faces of the cavity, from the side surface of the nitride semiconductor layer to be formed into a chip, and width (the length in the direction perpendicular to the end faces of the cavity to be formed into a chip). The cleaving is performed using the recessed grooves as a cleavage-assist grooves from the side of the substrate on which the n-electrode is formed to produce bars in which the cleavage faces (plane 1-100, which is the plane corresponding to the lateral face of a hexagonal crystal, which is to say, the M plane) are the cavity end faces. The cavity length is set to 800 μm.

The first film and the second film which are composed of AlN are formed on the end face of the cavity, and the third film is formed thereon.

That is, an AlN film is formed as the first film in a thickness of 200 Å with an ECR sputtering apparatus at a microwave power of 500 W, an RF power of 250 W, an argon flow of 30 sccm, and a nitrogen flow of 10 sccm, and at a film formation rate of 50 Å/min. And then, an AlN film is formed as the second film in a thickness of 200 Å with an ECR sputtering apparatus under the same condition as that of the first film, except that at an RF power of 650 W, and at a film formation rate of 100 Å/min.

Next, on the light exit face of the cavity, an SiO$_2$ film is formed as the thirs film in a thickness of 2500 Å with a sputtering apparatus using a Si target, at an RF power of 500 W, and an oxygen flow of 5 sccm. And then, on the light reflecting side of the cavity, an SiO$_2$ film is formed in a thickness of 2500 Å under the same condition as that of SiO$_2$ film of the light exit face, further SiO$_2$/ZrO$_2$ films are formed in the thickness of 670 Å/440 Å with six cycle repetition to obtain the third film 23.

Lastly, the bar is diced in the direction parallel to the p-electrode, to produce semiconductor laser elements as chips.

When a protective film having a hexagonal crystal structure composed of a first film with the same axial orientation as that of the end face of the cavity and a second film with a different axial orientation from that of the first film is thus formed on the end face of the cavity, no stress is produced in the nitride semiconductor that makes up the end face of the cavity, and there is no cracking in the nitride semiconductor and the protective film. This make it possible to provide good adhesive with the end face of the cavity, to prevent the separation of the protective film, and in turn to improve COD level.

To test the protective film of the nitride semiconductor laser element thus obtained, films were formed by substantially the same method and from the same materials as above on an n-GaN substrate (M axis orientation: M plane). More specifically, a second film of 750 Å was formed over a first film of 250 Å and composed of AlN (total thickness of 1000 Å), both of which were formed over a pretreated GaN substrate using an ECR sputtering apparatus at an argon flow of 30 sccm, an nitrogen flow of 10 sccm, a microwave power of 500 W, and an RF power of 250 W. The axial orientation of the films thus obtained were measured in the M axis direction and the C axis direction using an XRD apparatus (X-rays used: CuKα line (λ=0.154 nm), monochrometer: Ge (220), measurement method: ω scan, step width: 0.01°, scanning speed: 0.4 second/step). With this measurement device, the vicinity of 16 to 17° corresponded to a peak originating in AlN and indicating M axis orientation, and the vicinity of near 18° corresponded to a peak originating in AlN and indicating C axis orientation. These results are shown in FIGS. 3A and 3B.

The larger of the graphs in FIGS. 3A and 3B shows the peak originating in AlN and indicating M axis orientation and C axis orientation.

For the peak originating in AlN and having C axis orientation near 18°, in the case of FIG. 3A (the second film having the thickness of 750 Å formed on the first film having the thickness of 250 Å), a peak for AlN oriented along the C axis is seen. In FIG. 3B (the first film having the thickness of 250 Å), almost no peak is seen originating in AlN and having C axis orientation.

The smaller of the enlarged graphs in FIGS. 3A and 3B shows the peak originating in AlN and indicating M axis orientation.

In the smaller of the graphs, almost no change is seen in the peak originating in AlN and having M axis orientation that would be attributable to a change in the thickness of the AlN film, and it can be seen that the peak for AlN having M axis orientation does not depend on the thickness in which the films are formed. In other words, it would be understood that AlN film having M axis is present at a certain amount, even with decreasing their thickness. Specifically, forming first and second films as in the present invention makes it possible to form a protective film in which the first film has a crystal structure with the same axial orientation as the end face of the cavity, and the second film has a crystal structure with a different axial orientation from that of the first film. As a result, the axial orientation of the protective film can be varied from the M axis to the C axis, and separation of the protective film can be prevented.

As to the change in the proportions of AlN of M axis orientation and of C axis orientation accompanying an increase in the thickness of the AlN film, near the GaN boundary, the AlN is oriented along the M axis, and up to a film thickness of about 200 to 250 Å, the AlN oriented along the C axis gradually increases along with film thickness, and when the film thickness increases beyond this, it is predicted that there will be sudden increase in the proportion of AlN oriented along the C axis.

EXAMPLE 2

This Example is the same as Example 1, except that the end face of the cavity has A axis orientation, and as shown in FIG.

2A, the protective film is composed of a first film 21a that is oriented along the same axis as the end face of the cavity (that is, the A axis) and a second film 21b that is oriented along the C axis, for at least one end face of the cavity of the cavity.

The first and second films are formed under the same conditions as in Example 1.

The same effect as in Example 1 is also obtained in this Example.

EXAMPLE 3

This Example is the same as Example 1, except that the end face of the cavity is formed by RIE. The end face of the cavity in this Example is formed by a nitride semiconductor layer having M axis orientation, and as shown in FIG. 2A, the protective film is composed of a first film 21a that is oriented along the same axis as the end face of the cavity (that is, the M axis) and a second film 21b that is oriented along the C axis, for at least one end face of the cavity of the cavity. The first and second films are both composed of AlN, the combined thickness is about 1200 Å, for example, and the thickness of the first film is about 200 Å. The orientation state gradually changes from the first film to the second film.

The method for manufacturing the laser element in this Example is using RIE for forming the end face of the cavity, as follows.

More specifically, a protective film composed of $SiO_2$ is formed on the surface of a p-side contact layer of a wafer on which a nitride semiconductor has been grown, this is etched so that the cavity length will be 800 μm to form a striped structure and expose the end face of the cavity. The etching here is performed so that the end face of the cavity will be the M plane.

Next, just as in Example 1, a ridge, protective film, and electrode are formed, and this product is divided into bars.

First and second films composed of AlN are formed under the same conditions as in Example 1 on the end face of the cavity that has been divided into bars, and an amorphous $SiO_2$ film is formed over this.

The same effect as in Example 1 is also obtained in this Example.

EXAMPLE 4

This Example is the same as Example 3, except that the end face of the cavity has A axis orientation, the protective film is composed of a first film 21a oriented along the same axis as the end face of the cavity (that is, the A axis) and a second film 21b that is oriented along the C axis, for at least one end face of the cavity of the cavity, as shown in FIG. 2A.

The same effect as in Example 1 is also obtained in this Example.

EXAMPLE 5 and 6

This Example is the same as Example 1, except that the protective film is formed as table 1.

TABLE 1

|  | First Film | Second Film |
|---|---|---|
| Example 5 | 200 Å | 1000 Å |
| Example 6 | 50 Å | 250 Å |

The same effect as in Example 1 is also obtained in this Example.

EXAMPLE 7

This Example is the similar to Example 1, except that the semiconductor element of the Example has the constitution, i.e., each nitride semiconductor layer formed on the GaN substrate, shown in the following table, has the protective film (the first film and the second film) formed in the thickness of 320 Å, and emission wavelength of 370 to 380 nm.

TABLE 2

| p-Contact Layer | p-GaN: 15 nm |
|---|---|
| P-Clad Layer | p-$Al_{0.10}Ga_{0.90}N$: 450 nm |
| p-Wave Guide Layer | $Al_{0.05}Ga_{0.95}N$: 160 nm |
| p-Cap layer | p-$Al_{0.22}Ga_{0.78}N$: 13 nm |
| Active Layer (SQW) | Last Barrier Layer   $Al_{0.11}Ga_{0.89}N$: 5.5 nm |
|  | 1st Well Layer   $In_{0.01}Ga_{0.99}N$: 15 nm |
|  | 1st Barrier Layer   n-$Al_{0.11}Ga_{0.89}N$: 7.5 nm |
| n-Wave Guide Layer | $Al_{0.05}Ga_{0.95}N$: 140 nm |
| n-Clad Layer | n-$Al_{0.08}Ga_{0.92}N$: 730 nm |

To test the constitution of the protective film of the nitride semiconductor laser element thus obtained, cross section of the nitride semiconductor element were observed using a field-emission electron microscope (JEM-2010F), and measure high-light sighting TEM images. This can be measured by entering electron beam to the protective film from the GaN (11-20) plane in the condition of camera length of 50 cm.

Figure 5A:
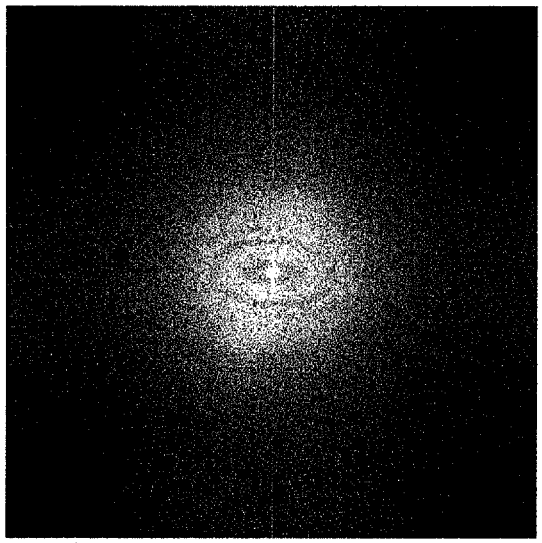
FIG. 5A to 5D are cross sectional TEM image (Transmission Electron Microscope), Electron Diffraction image of the protective film of the present invention.
Figure 5B:
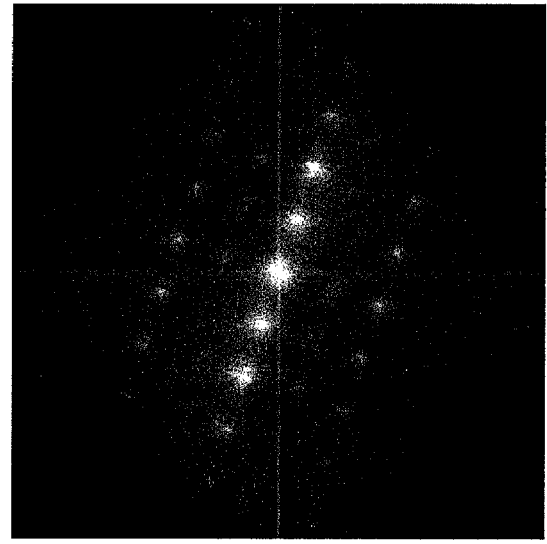
Figure 5C:
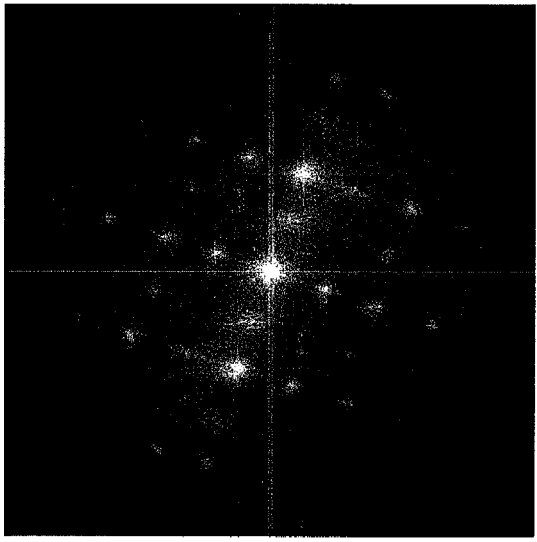
Figure 5D:
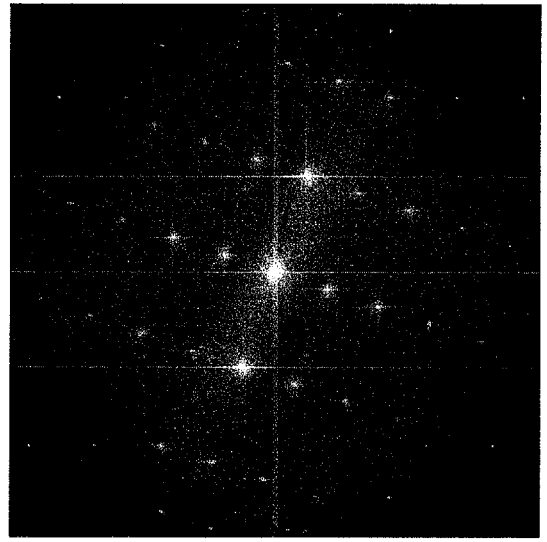

FIGS. 5A to 5D show cross sectional photomicrographs in which diffraction patterns of electron beam are performed FFT, and indicate the state of axis orientation at each point within the protective film shown in FIG. 4. FIG. 5A indicates the state of axis orientation of the crystal in the third film, FIGS. 5B and 5C indicate the state of axis orientation of the crystal in the protective film (the first film and the second film), FIG. 5D indicates the state of axis orientation of the crystal of the semiconductor layer near the end face of the cavity.

From the photomicrographs of the FIG. 4, it is confirmed that the semiconductor layer near the end face of the cavity has the crystal structure of M axis orientation, the protective film has a region in which the crystal structure changes from M axis orientation to C axis orientation, and also the third film has a state of amorphous.

That is, it is confirmed that the protective film has a crystal structure with the same axial orientation as that of the nitride semiconductor layer constituting the end face of the cavity and another crystal structure with the different axial orientation as that of the above thereon.

It is noted that when the film formed on the end face of the cavity or positioned near the end face of the cavity is observed, diffraction points of the GaN that makes up the nitride semiconductor layer in addition to diffraction points of the crystalline that makes up the protective film is developed, in this instance, it may separate the points of the GaN and analyze them.

The same effect as in Example 1 is also obtained in this Example.

EXAMPLE 8

The semiconductor laser element of this example had substantially the same configuration as in Example 1, except that the formation way of the protective film on the end face of the cavity as follows.

Using ECR sputtering apparatus, a condition of the first film formation is set at a microwave power of 500 W, an RF power of 250 W, an argon flow of 30 sccm, a nitrogen flow of 10 sccm, and film formation rate of 50 Å/min to obtain the AlN film (200 Å thick), and then a condition of the second film formation is set at a microwave power of 500 W, an RF power of 250 W, an argon flow of 30 sccm, a nitrogen flow of 15 sccm, and film formation rate of 30 Å/min to obtain the AlN film (200 Å thick).

The same effect as in Example 1 is also obtained in this Example.

EXAMPLE 9

The semiconductor laser element of this example had substantially the same configuration as in Example 1, except that the formation way of the protective film on the end face of the cavity as follows.

Using ECR spattering apparatus, a condition of the first film formation is set at a microwave power of 500 W, an RF power of 250 W, an argon flow of 30 sccm, a nitrogen flow of 10 sccm, and film formation rate of 50 Å/min to obtain the AlN film (200 Å thick), and then a condition of the second film formation is set at a microwave power of 500 W, an RF power of 250 W, an argon flow of 15 sccm, a nitrogen flow of 15 sccm, and film formation rate of 25 Å/min while the target is separated 10 cm from a sample to obtain the AlN film (200 Å thick).

The same effect as in Example 1 is also obtained in this Example.

The present invention can be applied to a wide range of nitride semiconductor elements with which the protective film needs to adhere well to the semiconductor layer, such as in use as light emitting elements (e.g., LD, LED, super luminescence diode, etc.), solar cells, light-receptive elements (e.g., light sensor, etc.), electric devices (e.g., transistor, power device, etc.) and the like. In particular, it is useful as nitride semiconductor elements in optical disk applications, optical communications systems, printers, optical exposure applications, and various devices for measurement, excitation light source for bio-specific applications and the like.

This application claims priority to Japanese Patent Application Nos. 2006-356288 and 2007-323204. The entire disclosure of Japanese Patent Application Nos. 2006-356288 and 2007-323204 are hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing description of the embodiments according to the present invention is provided for illustration only, and not for the purpose of limiting the invention as defined by the appended claims and their equivalents.

What is claimed is:

1. A nitride semiconductor laser element comprising:
a nitride semiconductor layer that includes a first nitride semiconductor layer, an active layer, and a second nitride semiconductor layer laminated in a lamination direction in this order, the nitride semiconductor layer having a pair of cavity end faces extending in the lamination direction; and
a protective film formed on at least one of the cavity end faces,
the protective film being formed of a first film formed on the at least one of the cavity end faces and a second film formed on the first film, with the first film having a crystal structure that has the same axial orientation as that of the nitride semiconductor layer adjacent to the at least one of the cavity end faces, and a second film having a crystal structure that has a different axial orientation from that of the first films,
the first film having wider bandgap energy than the active layer; and
the at least one of the cavity end faces of the nitride semiconductor layer being the M-plane, A-plane, C-plane, or R-plane.

2. The element according to claim 1, wherein
the first film and second film are composed of the same material.

3. The element according to claim 1, wherein the at least one of the cavity end faces of the nitride semiconductor layer is the M-plane.

4. The element according to claim 1, wherein
the first film and second film have a hexagonal system crystal structure,
the first film has a crystal structure with M axis orientation, and
the second film has a crystal structure with C axis orientation.

5. The element according to claim 1, wherein
the protective film further comprises a third film composed of amorphous on the second film.

6. The element according to claim 5, wherein
the third film is formed thicker than the combined thickness of the first film and the second film.

7. The element according to claim 5, wherein
the protective film has the total thickness of 50 Å to 2 μm.

8. A nitride semiconductor laser element comprising:
a laminated structure that includes a first nitride semiconductor layer, an active layer, and a second nitride semiconductor layer laminated in a lamination direction in this order, the laminated structure having a pair of cavity end faces extending in the lamination direction; and
a protective film formed on at least one of the cavity end faces,
the protective film being formed of a first film formed on the at least one of the cavity end faces and a second film formed on the first film with the first film being arranged to widen the bandgap energy of the at least one of the cavity end faces, and the second film having a crystal structure with different axial orientation from that of the first films,
the first film and second film having a hexagonal system crystal structure, the first film having a crystal structure that has the same axial orientation as that of the nitride semiconductor layer adjacent to the at least one of the cavity end faces.

9. The element according to claim 8, wherein
the protective film further comprises a third film composed of amorphous on the second film.

10. The element according to claim 9, wherein
the third film is formed thicker than the combined thickness of the first film and the second film.

11. A nitride semiconductor laser element comprising:
a laminated structure that includes a first nitride semiconductor layer, an active layer, and a second nitride semiconductor layer laminated in a lamination direction in this order, the laminated structure having a pair of cavity end faces extending in the lamination direction; and a protective film formed on at least one of the cavity end faces, the protective film being formed of a first film formed on the at least one of the cavity end faces and a second film formed on the first film with the first film being arranged to widen the bandgap energy of the at least one of the cavity end faces, and the second film having a crystal structure with different axial orientation from that of the first film, the protective film further comprising a third film composed of amorphous on the second film, the protective film having the total thickness of 50 Å to 2 μm.

* * * * *